United States Patent
Xu (12) United States Patent (10) Patent No.: US 10,630,210 B2
(45) Date of Patent: Apr. 21, 2020

(54) OPTOCOUPLER-BASED CONTROL CIRCUIT AND METHOD THEREOF

(71) Applicant: Zhejiang Holip Electronic Technology Co., Ltd., Haiyan, Zhejiang (CN)

(72) Inventor: Xiaoran Xu, Beijing (CN)

(73) Assignee: Zhejiang Holip Electronic Technology Co., Ltd., Haiyan, Zhejiang (CN)

(*) Notice: Subject to any disclaimer, the term of this patent is extended or adjusted under 35 U.S.C. 154(b) by 83 days.

(21) Appl. No.: 16/108,967

(22) Filed: Aug. 22, 2018

(65) Prior Publication Data

US 2019/0068088 A1 Feb. 28, 2019

(30) Foreign Application Priority Data

Aug. 31, 2017 (CN) .......................... 2017 1 0776976

(51) Int. Cl.
*H02P 3/18* (2006.01)
*H03K 17/691* (2006.01)
(Continued)

(52) U.S. Cl.
CPC ............... *H02P 3/18* (2013.01); *G05B 9/02* (2013.01); *H02P 29/0241* (2016.02);
(Continued)

(58) Field of Classification Search
CPC ......... H02P 29/0241; H02P 3/18; G05B 9/02; H03K 17/691; H03K 17/7955
(Continued)

(56) References Cited

U.S. PATENT DOCUMENTS 6,211,719 B1 * 4/2001 deBrigard .......... H03K 17/6872
326/30
6,355,936 B1 * 3/2002 Mastio ............... H04B 10/2504
250/551
(Continued)

FOREIGN PATENT DOCUMENTS

DE 102009050645 A1 4/2011
DE 102011003922 A1 8/2012
(Continued)

*Primary Examiner* — Jorge L Carrasquillo
(74) *Attorney, Agent, or Firm* — McCormick, Paulding & Huber PLLC (57) ABSTRACT

An optocoupler based control circuit and a method thereof are disclosed. The control circuit comprises a first control branch, which includes a first control signal input terminal configured to receive a first OFF function control signal; a first optocoupler, wherein a primary side of the first optocoupler is coupled to the first control signal input terminal, and an output of a secondary side of the first optocoupler is configured to control a first power supplied to a motor driving circuit; a first primary side on/off control circuit connected to the primary side of the first optocoupler, and configured to periodically turn on and off the coupling of the primary side to the first control signal input terminal; and a first secondary side filter circuit connected to the secondary side of the first optocoupler, and configured to filter the output of the secondary side, and configured as a low pass filter having a cutoff frequency lower than an on/off frequency of the primary side. The control circuit further comprises a diagnostic circuit configured to diagnose an operating state of the control circuit based on the output of the secondary side of the first optocoupler and the first power. The control circuit may be a Safe Torque Off (STO) circuit.

19 Claims, 6 Drawing Sheets

(51) Int. Cl.
*G05B 9/02* (2006.01)
*H02P 29/024* (2016.01)
*H03K 17/795* (2006.01)
*H02P 27/08* (2006.01)

(52) U.S. Cl.
CPC ....... *H03K 17/691* (2013.01); *H03K 17/7955* (2013.01); *G05B 2219/24054* (2013.01); *G05B 2219/25458* (2013.01); *H02P 27/08* (2013.01)

(58) Field of Classification Search
USPC ........................................................ 318/689
See application file for complete search history.

(56) References Cited

U.S. PATENT DOCUMENTS

| | | | | |
|---|---|---|---|---|
| 9,194,718 | B2* | 11/2015 | Matzen | G01D 3/036 |
| 9,899,175 | B2* | 2/2018 | Veil | G05B 9/03 |
| 2014/0204639 | A1* | 7/2014 | Wu | H02M 1/4225 |
| | | | | 363/89 |

FOREIGN PATENT DOCUMENTS

| | | |
|---|---|---|
| DE | 102013106739 A1 | 12/2014 |
| DE | 102013224674 A1 | 6/2015 |

* cited by examiner

OPTOCOUPLER-BASED CONTROL CIRCUIT AND METHOD THEREOF

CROSS-REFERENCE TO RELATED APPLICATION

This application claims foreign priority benefits under U.S.C. § 119 to Chinese Patent Application No. 201710776976.1 filed on Aug. 31, 2017, the content of which is hereby incorporated by reference in its entirety.

TECHNICAL FIELD

The present disclosure relates to a field of electronic circuits and, more particularly, to an optocoupler based control circuit and a method thereof.

BACKGROUND

Optocouplers are used in Safe Torque Off (STO) circuits for cost and electrical safety reasons. Typically, the STO is rarely triggered in systems with low security requirements. That is, a primary side (light emitting diode, LED) of the optocoupler is in an always-ON state for an extremely long period of time. This will seriously reduce the lifetime of the optocoupler. In addition, since there is almost no chance to turn off the LED of the optocoupler for effective diagnosis, a stuck-at fault may occur and safety may be affected.

In general, the reliability of the optocoupler is not very high (compared to other types of isolating components). Therefore, in systems with high safety requirements, it is important to diagnose whether the optocoupler is operating properly. A conventional approach is to add an inversed optocoupler in a STO channel (typically, for high reliability/safety, a redundant configuration is employed, for example, two STO channels are used) to trigger an online dynamic check signal. This leads to an increase in cost and circuit/software complexity. Another approach is to use a dynamic power source in the STO channel, but this requires to add a transformer, which will occupy a lot of space.

SUMMARY

In view of this, the object of the present disclosure is, at least in part, to provide an optocoupler-based control circuit and a method thereof that enables an extension of optocoupler lifetime and an improvement in circuit reliability/safety in a relatively simple manner.

According to an embodiment of the present disclosure, there is provided a control circuit comprising a first control branch. The first control branch includes: a first control signal input terminal configured to receive a first OFF function control signal; a first optocoupler including a primary side and a secondary side, wherein the primary side is coupled to the first control signal input terminal, and an output of the secondary side is configured to control a first power supplied to a motor driving circuit; a first primary side on/off control circuit connected to the primary side of the first optocoupler, and configured to periodically switch on and off the coupling of the primary side to the first control signal input terminal; and a first secondary side filter circuit connected to the secondary side of the first optocoupler, and configured to filter the output of the secondary side, wherein the first secondary side filter is configured as a low pass filter having a cutoff frequency lower than an on/off frequency of the primary side controlled by the first primary side on/off control circuit. The control circuit further comprises a diagnostic circuit configured to diagnose an operating state of the control circuit based on the output of the secondary side of the first optocoupler and the first power.

According to an embodiment of the present disclosure, the control circuit may further comprises a second control branch. The second control branch includes: a second control signal input terminal configured to receive a second OFF function control signal; a second optocoupler including a primary side and a secondary side, wherein the primary side is coupled to the second control signal input terminal, and an output of the secondary side is configured to control a second power supplied to the motor driving circuit; a second primary side on/off control circuit connected to the primary side of the second optocoupler, and configured to periodically turn on and off the coupling of the primary side to the second control signal input terminal; and a second secondary side filter circuit connected to the secondary side of the second optocoupler, and configured to filter the output of the secondary side, wherein the second secondary side filter is configured as a low pass filter having a cutoff frequency lower than an on/off frequency of the primary side controlled by the second primary side on/off control circuit, the diagnostic circuit is further configured to diagnose the operating state of the control circuit based on the output of the secondary side of the second optocoupler and the second power. The second branch may provide a redundant configuration.

According to an embodiment of the present disclosure, each of the first primary side on/off control circuit and the second primary side on/off control circuit may respectively have one of: a series connection configuration comprising a switch device connected in series with a primary side of a respective optocoupler and configured to be periodically turned on and off so as to periodically turn on/off the coupling of the primary side of the respective optocoupler to a respective control signal input terminal; or a parallel connection configuration comprising a bypass branch connected in parallel with a primary side of a respective optocoupler, the bypass branch comprising a switch device configured to periodically turn on and off so as to periodically bypass the primary side of the respective optocoupler.

According to an embodiment of the present disclosure, the first primary side on/off control circuit and the second primary side on/off control circuit may each have the series connection configuration and share the same switching device or have different respective switching devices. Alternatively, one of the first primary side on/off control circuit and the second primary side on/off control circuit may have the series connection configuration, and the other may have the parallel connection configuration. Alternatively, the first primary side on/off control circuit and the second primary side on/off control circuit each has the parallel connection configuration.

According to an embodiment of the present disclosure, the first primary side on/off control circuit and the second primary side on/off control circuit may each comprise an oscillator configured to output oscillating signal for controlling respective switch device. The power supplied to respective oscillators of the first primary side on/off control circuit and the second primary side on/off control circuit may be based on an input at the first control signal input terminal and an input at the second control signal input terminal, respectively.

According to an embodiment of the present disclosure, the first primary side on/off control circuit and the second primary side on/off control circuit may share the same oscillator. A power may be supplied to the shared oscillator when an input at at least one of the first control signal input terminal and the second control signal input terminal is high.

According to an embodiment of the present disclosure, the first control branch may further include a first power transmission path configured to transmit the first power from a power source to the motor driving circuit, wherein the first power transmission path includes a first switch device, and the filtered output of the secondary side of the first optocoupler is configured to control the on/off of the first switching device so as to turn on or off the first power transmission path. Similarly, the second control branch may further include a second power transmission path configured to transmit the second power from the power source to the motor driving circuit, wherein the second power transmission path includes a second switch device, and the filtered output of secondary side of the second optocoupler is configured to control the on/off of the second switch device so as to turn on or off the second power transmission path. In this case, when the output of the secondary side of the first optocoupler indicates that the secondary side is in a continuous-OFF state, but the first power has a voltage sufficient to drive the motor driving circuit, the diagnostic circuit may determine that the first switching device has failed. In addition, when the output of the secondary side of the second optocoupler indicates that the secondary side is in the continuous-OFF state, but the second power has a voltage sufficient to drive the motor driving circuit, the diagnostic circuit may determine that the second switching device has failed.

According to an embodiment of the present disclosure, the low pass filter may comprise a RC low pass filter composed of a first resistor and a capacitor, to provide a filtered output across the capacitor. In addition, the control circuit may further comprise a second resistor connected across the capacitor, wherein compared to a resistance of the first resistor, a resistance of the second resistor is sufficiently large that a charge process of the capacitor is faster than a discharge process thereof.

According to an embodiment of the present disclosure, the diagnostic circuit, when determining that at least one of the first primary side on/off control circuit and the second primary side on/off control circuit has failed, is configured to instruct the control circuit to downgrade to operate at a low safety level or instruct a motor controller to stop outputting a drive control signal for the motor driving circuit.

According to an embodiment of the present disclosure, when the output of the secondary side of the first optocoupler is an oscillating waveform, and the first power has a voltage sufficient to drive the motor driving circuit, the diagnostic circuit may determine that the first control branch is in a normal operating state. In addition, when the output of the secondary side of the first optocoupler indicates that the secondary side is in a continuous-OFF state, and the first power has a voltage insufficient to drive the motor driving circuit, the diagnostic circuit may determine that an OFF function is activated in the first control branch or the optocoupler has failed. In addition, when the output of the secondary side of the first optocoupler indicates that the secondary side is in a continuous-ON state, and the first power has a voltage sufficient to drive the motor driving circuit, the diagnostic circuit may determine that the first optocoupler has failed.

According to an embodiment of the present disclosure, in the case where the first control branch and the second control branch share the same oscillator, when an output of a secondary side of an optocoupler on one of the first control branch and the second control branch is an oscillating waveform and a respective power has a voltage sufficient to drive the motor driving circuit, and an output of a secondary side of an optocoupler on the other of the first control branch and the second control branch indicates that the secondary side is in a continuous-OFF state and a respective power has a voltage insufficient to drive the motor driving circuit, the diagnostic circuit may determine that an OFF function is activated in the other control branch or a respective optocoupler has failed. In addition, when an output of a secondary side of one of the first optocoupler and the second optocoupler is the oscillating waveform, an output of a secondary side of the other of the first optocoupler and the second optocoupler indicates that the secondary side is in a continuous-ON state, and the first power and the second power have voltages sufficient to drive the motor driving circuit, the diagnostic circuit may determine that the optocoupler of which the secondary side is in the continuous-ON state has failed. In addition, when outputs of secondary sides of the first optocoupler and the second optocoupler indicate that the secondary sides of the first optocoupler and the second optocoupler are both in the continuous-ON state, and the first power and the second power have voltages sufficient to drive the motor driving circuit, the diagnostic circuit may determine that the shared oscillator has failed.

According to an embodiment of the present disclosure, the first OFF function control signal may be a first Safety Torque Off signal, and indicates to turn off the first power supplied to the motor driving circuit when it is not at high level. Similarly, the second OFF function control signal may be a second Safety Torque Off signal, and indicates to turn off the second power supplied to the motor driving circuit when it is not at high level.

According to an embodiment of the present disclosure, there is provided a method for operating the control circuit described above, comprising: providing a first OFF function control signal at a first control signal input terminal; periodically turning on and off a coupling of a primary side of a first optocoupler to the first control signal input terminal via a first primary side on/off control circuit; controlling a first power supplied to a motor driving circuit based on a filtered output of a secondary side of the first optocoupler provided at a first secondary side filter circuit; and diagnosing an operating state of the control circuit based on the output of the secondary side of the first optocoupler and the first power supplied to the motor driving circuit.

According to an embodiment of the present disclosure, there is provided an electronic device comprising the control circuit described above.

According to an embodiment of the present disclosure, there is provided a storage medium having stored thereon executable instructions that, when executed by one or more processors, cause the one or more processors to perform the method described above.

According to embodiments of the present disclosure, optocouplers are still used as isolating components, which are relatively low cost compared to other isolating components such as magnetic, capacitive, RF coupled isolators, and the like. In addition, the optocoupler operates in an on-off mode and does not always-ON, so its lifetime may be optimized. Moreover, the operating state of the circuit may be diagnosed, and the circuit may downgrade to operate at a low safety level when a fault is detected, but still remain operating.

BRIEF DESCRIPTION OF THE DRAWINGS

The above and other objects, features and advantages of the present disclosure will be more apparent from the following description of the embodiments of the present disclosure with reference to the accompanying drawings, in which.

Throughout the accompanying drawings, the same or similar reference signs indicate the same or similar components.

DETAILED DESCRIPTION

Hereinafter, embodiments of the present disclosure will be described with reference to the drawings. It should be understood, however, that the description is only illustrative, and is not intended to limit the scope of the present disclosure. In addition, descriptions of well-known structures and techniques are omitted in the following description in order to avoid unnecessarily obscuring the concept of the present disclosure.

The terms used herein are merely for the purpose of describing particular embodiments, and are not intended to limit the present disclosure. The words "a", "an", and "the", etc., used herein should also include the meaning of "multiple" and "a plurality of", unless the context clearly states otherwise. In addition, the terms "include", "comprise", etc., used herein indicate the existence of features, steps, operations and/or components, but do not exclude the existence or addition of one or more other features, steps, operations or components.

All terms used herein, including technical and scientific terms, have the meaning commonly understood by one of ordinary skill in the art, unless otherwise defined. It should be noted that the terms used herein should be interpreted as having a meaning consistent with the context of the present specification but not be interpreted in an ideal or too rigid manner.

Unless otherwise specifically noted, numerical parameters in the present specification and the appended claims are approximations, and may vary according to the desired characteristics obtained through the content of the present disclosure. In particular, all numbers expressing the content of compositions, reaction conditions, and the like, as used in the specification and claims, should be understood as being modified by the term "about" in all instances. In general, the meaning of its expression refers to the inclusion of a variation of a particular amount, such as ±10% or more or less, in some embodiments.

The ordinal numbers used in the specification and claims, such as "first", "second", "third", and the like, are used to modify a corresponding element, but the ordinal numbers per se do not mean that the element has any ordinal number, nor represent the order of one component and another component, or the order in which it is made, or its importance. The ordinal numbers are only used in order to make a component with a certain name clearly distinguishable from another component with the same name.

Figure 1:
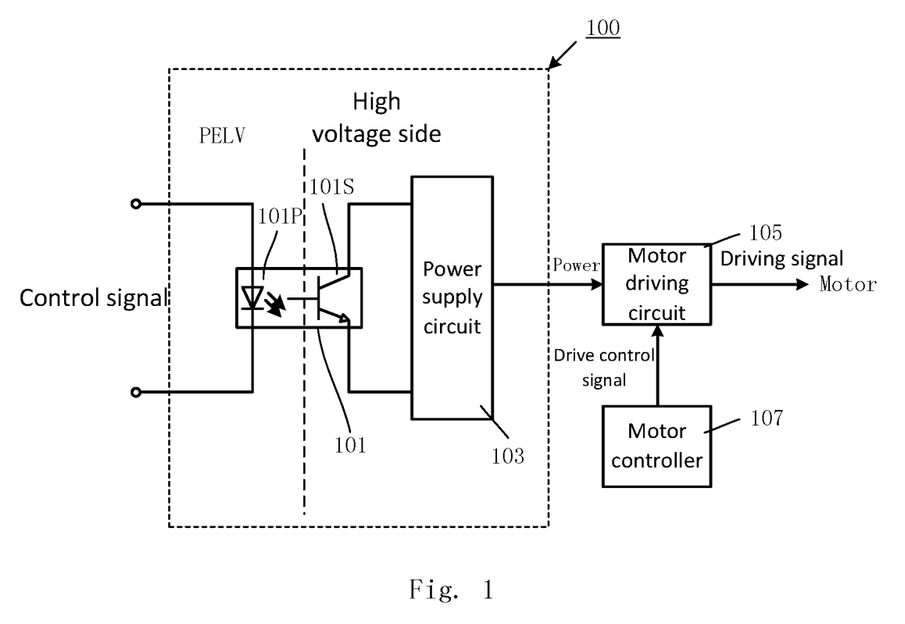
FIG. 1 schematically illustrates a block diagram of a control circuit for motor driving.

FIG. 1 schematically illustrates a block diagram of a control circuit for motor driving.

As shown in FIG. 1, a control circuit 100 can be divided into a low voltage (e.g., Protective Extra Low Voltage, PELV) side and a high voltage side. The low voltage side primarily involves low voltages, such as various control signals; and the high voltage side primarily involves high voltages, such as a power supplied to a load (e.g., a motor). For the purpose of electrical safety, an electrically isolating component, such as an optocoupler 101, is disposed between the low voltage side and the high voltage side. The optocoupler 101, on the one hand, may enable the electrical isolation between the low-voltage side and the high-voltage side, and on the other hand may transfer the control of the low-voltage side to the high-voltage side (in an optical manner).

Specifically, the photocoupler 101 may include a primary side 101P and a secondary side 101S. The primary side 101P may be in the form of a light emitting diode (LED) that is turned on or off according to a control signal received at a control signal input terminal. For example, when the control signal is at a high level (this results in the voltage applied across the LED being higher than the turn-on voltage of the LED), the LED may be turned on and emit light; and when the control signal is at a non-high level (e.g., at a low level or opened), the LED may be turned off. The secondary side 101S may be in the form of a triode, and an optical signal emitted by the LED of the primary side 101P may be used as its base signal. More specifically, when the LED of the primary side 101P is turned on and emits light, the triode of the secondary side 101S may be turned on; and when the LED of the primary side 101P is turned off and does not emit light, the triode of the secondary side 101S may be turned off.

Therefore, the secondary side 101S may be turned on or off according to the control signal at the control signal input terminal. The on/off of the secondary side 101S may control a power supply of a power supply circuit 103. For example, the on/off of the secondary side 101S may control a power supplied to the external load by the power supply circuit 103 to be turned on/off accordingly. Thus, a motor driving circuit 105 powered by the power supply circuit 103 may operate (in the case that power is supplied) or stop operating (in the case that no power is supplied) accordingly based on the control signal at the control signal input terminal.

The motor driving circuit 105 may operate by utilizing the power supplied by the power supply circuit 103. Specifically, the motor driving circuit 105 may output a drive signal to the motor so as to drive the motor to operate, according to a drive control signal (for controlling a rotation/stop of the motor, an rotating speed, etc., for example, a pulse width modulation (PWM) signal) provided by a motor controller 107. Typically, the drive control signal provided by the motor controller 107, such as a PWM signal, is at a low voltage (e.g., about 3.3V). The motor driving circuit 105 may output a drive signal of a high voltage (e.g., about 20 V) by utilizing the power supply of the power supply circuit 103. The drive signal corresponds to the drive control signal, and is, for example, a PWM signal of the same waveform therewith.

A rotational torque may be provided to the motor via a switch device such as an Insulated Gate Bipolar Transistor (IGBT). For a three-phase motor, it is usually possible to dispose six IGBTs, with three ones on each of the high side and the low side. The drive signal output by the motor driving circuit 105 may be coupled to a gate of the IGBT to control the on/off of the IGBT. Accordingly, the motor controller 107 may output 6 drive control signals, such as PWM signal, for the 6 IGBTs. The motor driving circuit 105 may include a high side driver and a low side driver (see 405H and 405L in FIG. 4) for high side IGBTs and low side IGBTs, respectively, which respectively receives 3 respective drive control signals and outputs 3 (gate) drive signals for 3 respective IGBTs. The rotating speed of the motor may be adjusted by a duty cycle of the PWM signal. It should be pointed out here that respective control branches may be provided for the high-side driver and the low-side driver, respectively (see FIG. 4).

The control circuit 100 may be a Safe Torque Off (STO) circuit. In this case, the control signal at the control signal input terminal may be the STO signal. In general, the STO signal being at a high level (e.g., about 24V) is in an "invalid" state, i.e., indicating that the motor is operating properly and does not need to be turned off; and the STO signal being at a non-high level (e.g., at a low voltage, such as 0V, or opened) is in an "valid" state, i.e., indicating that the motor is turned off. Here, the so called "high level" refers to a voltage that may effectively turn on the LED of the primary side 101P of the optocoupler 101; and the "non-high level" refers to a voltage that maintains the LED of the primary side 101P of the optocoupler 101 being turned off. In general, the valid STO signal is rarely present in the system, i.e., the motor is essentially always keeping operating. In this case, the LED of the primary side 101P is almost always-on, which significantly affects the lifetime of the photocoupler 101.

Figure 2:
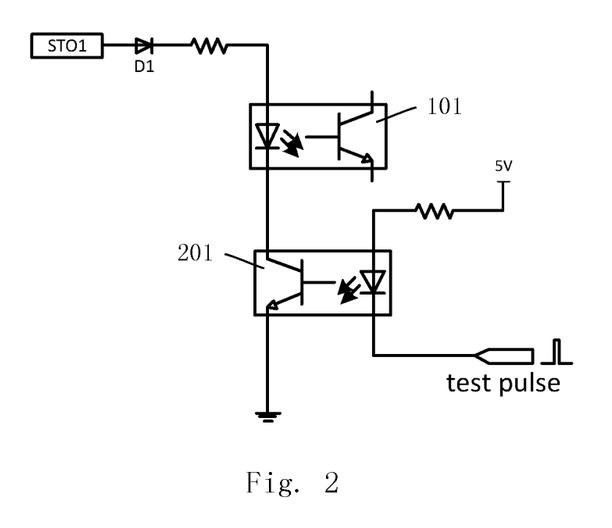
FIG. 2 schematically illustrates a circuit diagram for diagnosing by an inversed optocoupler.

As described above, a diagnostic function may be enabled by adding an inversed optocoupler. FIG. 2 schematically illustrates a circuit diagram for diagnosing by an inversed optocoupler.

As shown in FIG. 2, an inversed photocoupler 201 may be connected in series at the primary side of the optocoupler 101. Specifically, a secondary side of the inversed photocoupler 201 may be connected in series with the primary side of the optocoupler 101, and a primary side of the inversed optocoupler 201 may be coupled to receive a test pulse.

In the operating state, a low voltage, such as a ground level, may be maintained at a test pulse input terminal so that the inversed optocoupler 201 remains to be turned on. In this case, the optocoupler 101 acts according to a control signal (e.g., a STO signal, such as a STO1 shown in FIG. 2), as described above in conjunction with FIG. 1. During the test, a high voltage pulse may be applied to the test pulse input terminal, such that the primary side LED of the inversed photocoupler 201 is temporarily turned off, and correspondingly the secondary side triode of the inversed photocoupler 201 is temporarily turned off. Then, the primary side LED of the optocoupler 101 is temporarily opened, and thus the secondary side triode of the optocoupler 101 should be temporarily turned off. The ON state of the secondary side triode of the photocoupler 101 may be tested, so as to confirm whether a stuck-at fault has occurred.

However, as mentioned above, this increases cost and circuit/software complexity.

Unlike a conventional technology in which a primary side of a optocoupler maintains in an always-ON state during normal operation, according to an embodiment of the present disclosure, a primary side of a optocoupler may be intermittently turned on, that is, be in a mode in which it is alternately turned on and off. In this way, an on-time of the optocoupler may be reduced, thereby extending the lifetime of the optocoupler. Due to such on-off switching at the primary side, there will also be an on-off switching occurring correspondingly at the secondary side. However, in normal operation, a stable power supply should be maintained, which requires a stable output from a secondary side. In order to output a stable signal from a secondary side where an on-off switching occurs, a low pass filter may be added at an output of the secondary side. A cutoff frequency of the low pass filter may be set to be lower than an on/off frequency of the primary/secondary side, which may filter out high frequency characteristics due to the on-off switching and output a substantially stable signal.

Figure 3:
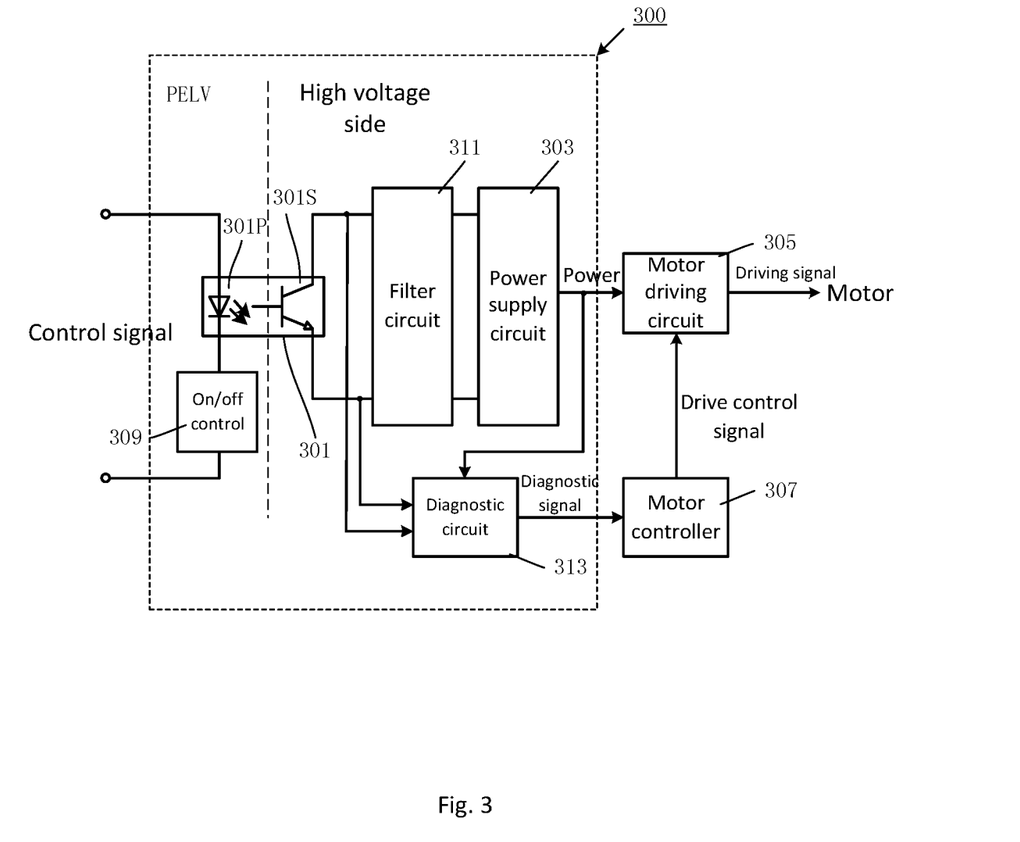
FIG. 3 schematically illustrates a block diagram of a control circuit according to an embodiment of the present disclosure.

FIG. 3 schematically illustrates a block diagram of a control circuit according to an embodiment of the present disclosure.

Similar to the control circuit 100 shown in FIG. 1, a control circuit 300 according to the present embodiment may include an optocoupler 301. The photocoupler 301 includes a primary side 301P and a secondary side 301S. Regarding the photocoupler 301, reference may be made to the above description of the optocoupler 101 in conjunction with FIG. 1.

The primary side 301P may be coupled to a control signal input terminal, so as to be controlled by a control signal at the control signal input terminal, such as an STO signal. As described above, in order to prevent the primary side 301P from being in an always-ON state during normal operation, a primary side on/off control circuit 309 may be disposed in an electrical path between the primary side 301P and the control signal input terminal. The primary side on/off control circuit 309 may control the on/off of the electrical path between the primary side 301P and the control signal input terminal. More specifically, the primary side on/off control circuit 309 may periodically turn on and off a coupling of the primary side 301P to the control signal input terminal. As such, on the one hand, the primary side 301P is under the control of the control signal at the control signal input terminal. For example, when the control signal is at a high level (in the case of the STO, an "invalid" STO signal, i.e., indicating that the motor should operate properly), an effective "power supply" to the primary side 301P and the on-off control circuit 309 is maintained, so that they can operate in a normal mode; when the control signal is at a non-high level (for example, in the case of the STO, an "valid STO" signal, for example, being at a ground voltage or opened, indicating that the motor should stop operating), the primary side 301P is turned off, and thus the secondary side 301S is also turned off, that is, the secondary side remains in an OFF state, thereby effectively enabling an OFF control (for example, the STO function). On the other hand, the primary side 301P is under the control of the primary side on/off control circuit 309. When the control signal is at a high level, the action of the on/off control circuit 309 will cause the primary side 301P to be periodically turned on and off. Accordingly, the secondary side 301S will be periodically turned on and off.

The control circuit 300 may further include a secondary side filter circuit 311 disposed at the output of the secondary side 301S. Due to the existence of the primary side on/off control circuit 309, the output at the secondary side 301S may be opened (in the case of a non-high level control signal indicating OFF), or an oscillating signal for an on/off switching (in the case of a high level control signal indicating operating). The secondary side filter circuit 311 may be configured as a low pass filter in which a cutoff frequency is lower than an oscillation frequency of the oscillation signal (that is, the on/off switching frequency at the primary side/secondary side). As such, in the case of the high level control signal indicating operating, the secondary side filter circuit 311 may filter the oscillating signal at the secondary side into a substantially stable signal (there may still be some fluctuations), similar to the case where the primary side 301P is always-on.

That is to say, by introducing the primary side on/off control circuit 309, an on-time of the primary side 301P is reduced, and thus the lifetime of the optocoupler may be increased. In addition, by disposing the secondary side filter circuit 311, although there exists the oscillating signal, the control circuit 300 may still control whether or not the motor operates based on the control signal in a stable manner, but not in an oscillating manner, without causing the motor to operate intermittently.

Also shown in FIG. 3 is a power supply circuit 303, a motor driving circuit 305, and a motor controller 307. With regard to these components, reference may be made to the above description of the power supply circuit 103, the motor driving circuit 105, and the motor controller 107 in conjunction with FIG. 1.

According to an embodiment, the control circuit 300 may further include a diagnostic circuit 313 for diagnosing an operating state of the control circuit. The diagnostic circuit 313 may take the output of the secondary side 301S and the power supplied to an external load by the power supply circuit 303 as inputs, and perform diagnosis based on these inputs, and the details of the diagnosis will be described in further detail below.

In addition, according to a diagnosis result of the diagnosis circuit 300, the control circuit 300 may be instructed to take different measures. For example, the diagnostic circuit 313 may output the diagnosis result to the motor controller 307. When the diagnosis result indicates that there is a fault in the control circuit, the motor controller 307 may control the motor to stop operating (for example, by stopping outputting a drive control signal to the motor driving circuit 305). According to another embodiment, when the diagnostic result indicates that there is a fault in the control circuit, the control circuit 300 may be downgraded to operate at a low security level. No diagnosis or only partial diagnosis may be made at the low security level, compared to a high security level, as will be described in further detail below.

In FIG. 3, an example of a single control branch is shown. However, the present disclosure is not limited thereto, but may include more control branches, each of which may also include an optocoupler, a primary side on/off control circuit, and a secondary side filter circuit.

Figure 4:
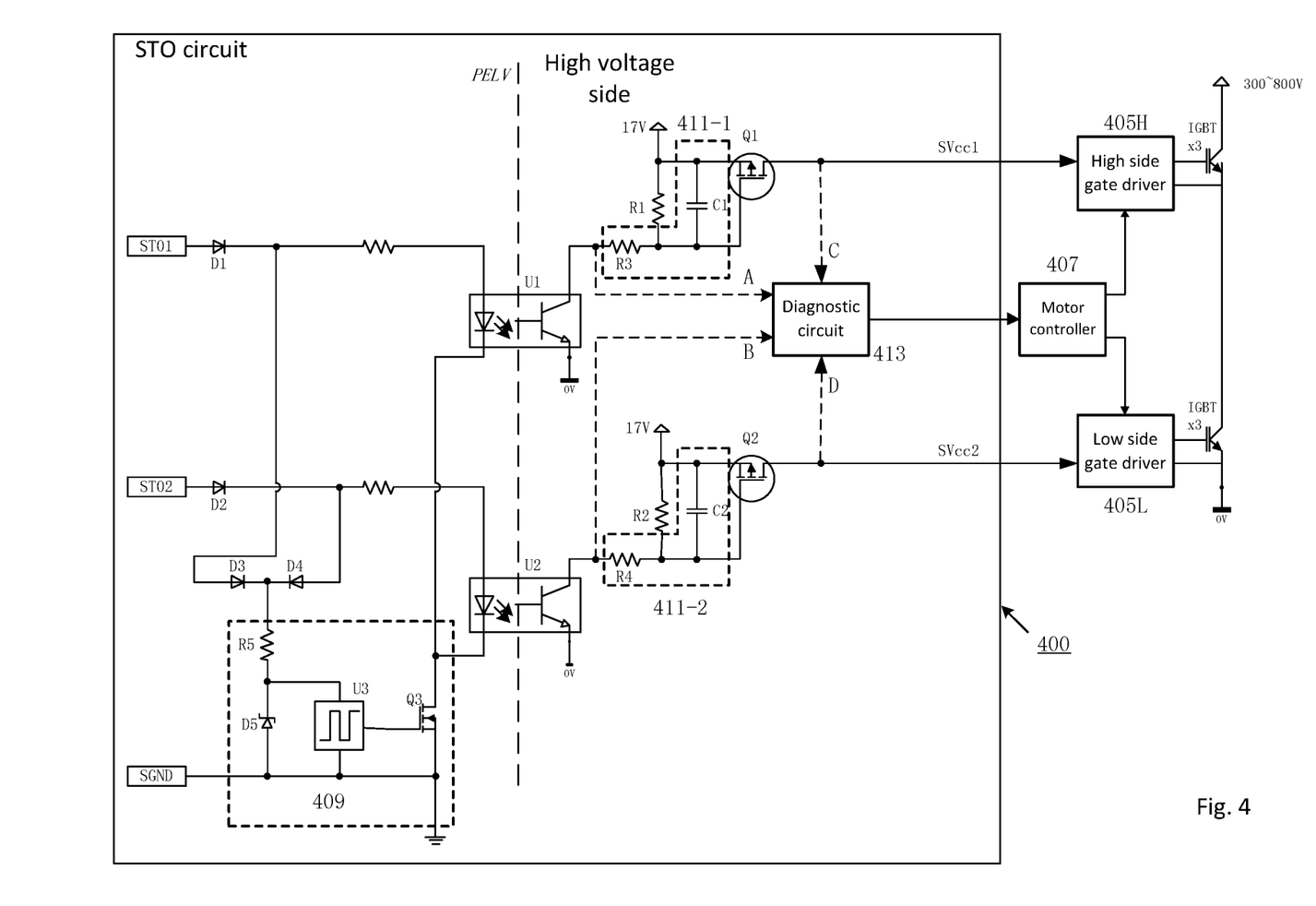
FIG. 4 schematically illustrates a circuit diagram of a control circuit according to an embodiment of the present disclosure.

Hereinafter, a specific example of the control circuit will be described by taking a STO as an example. FIG. 4 schematically illustrates a circuit diagram of a control circuit according to an embodiment of the present disclosure.

As shown in FIG. 4, a STO circuit 400 according to the present embodiment may include two control branches (STO1, U1, 411-1, Q1, SVcc1; STO2, U2, 411-2, Q2, SVcc2). As described above, this is a redundancy provided for the purpose of high reliability/security. Those skilled in the art should understand that there may be a single control branch and of course there may be more control branches.

The configuration of each control branch may be based on the configuration of the control circuit shown in FIG. 3. Specifically, a first control branch may include a first optocoupler U1 having a primary side coupled to a first STO signal input terminal STO1 and a secondary side connected to a first secondary side filter 411-1. Similarly, a second control branch may include a second optocoupler U2 having a primary side coupled to a second STO signal input terminal STO2 and a secondary side connected to a second secondary side filter 411-2.

In this example, the first control branch and the second control branch share the same primary side on/off control circuit 409. The primary side on/off control circuit 409 includes a switch device Q3 (for example, an NMOSFET) that is connected in series with the primary side of the first photocoupler U1 as well as the primary side of the second photocoupler U2. By periodically turning on and off the switch device Q3, the first STO signal at the STO1 and the second STO signal at the STO2 are periodically applied to the primary side of the first photocoupler U1 and the primary side of the second photocoupler U2, respectively.

There are various ways to control the on/off of the switch device Q3. For example, the on/off control of the switch device Q3 may be simply implemented by employing an oscillator U3. Specifically, the oscillator U3 may output an oscillation signal that oscillates between a high level and a low level, and the oscillation signal may be coupled to a gate of the switch device Q3.

Advantageously, an input at the STO signal input terminal may be utilized to supply power to the oscillator U3. As shown in FIG. 4, the STO1 and the STO2 may be introduced to the primary side on/off control circuit 409 through diodes D3 and D4, respectively. The diodes D3 and D4 are used to decouple the two paths. For the oscillator U3, a power supply circuit composed of a resistor R5 and a Zener diode D5 may be disposed. The power supply circuit is connected between a junction point of the diodes D3 and D4 and a STO signal ground SGND. When the input at any of the STO1 and the STO2 is at a high level, for example, +24V (with respect to the STO signal ground SGND) (an "invalid" STO signal, i.e., indicating that the motor operates properly), the junction point of the diodes D3 and D4 is at a high level (substantially the same as the voltage of the invalid STO signal, if not taking into account the diode voltage drop), and thus power may be supplied to the oscillator U3; and when the inputs at the STO1 and the STO2 each is at a non-high level, for example, at 0V or opened (an "valid" STO signal, i.e., indicating that the motor stops operating), there is no power being supplied to the oscillator U3, and thus the oscillator U3 stops oscillating.

The duty cycle of the oscillation signal of the oscillator U3 (or the duty cycle of the primary side) may be appropriately selected. On the one hand, the duty cycle should not be too high, which means that the on-time of the primary side is very long, being disadvantageous in maintaining the lifetime of the optocoupler. On the other hand, the duty cycle should not be too low, which is disadvantageous in providing a stable output at a side where the secondary side locates (because the charging time for the capacitor described below is too short). Therefore, the duty cycle may be, for example, about 50%.

The first secondary side filter 411-1 may be a low pass filter. In this example, an RC low pass filter composed of a resistor R3 and a capacitor C1 is shown, in which a filter output is provided across the capacitor C1. Further, a resistor R1 may be connected across the capacitor C1 to provide a discharge path of the capacitor C1 (the resistor R1 acts as a load of the RC low pass filter). Those skilled in the art are aware of various low pass filters, and the circuit shown in FIG. 4 is merely an example.

The configuration of the second secondary side filter 411-2 is similar to that of the first secondary side filter 411-1, in that, the second secondary side filter 411-2 is also an RC low pass filter composed of a resistor R4 and a capacitor C2, and the resistor R2 may be connected across the capacitor C2 as a load, and the details will not be repeated here.

The output of the secondary side filter may control the power supply circuit. In this example, the power supply circuit is a simple power transmission path, i.e., a power transmission line from the power source (17V in the figure) to the motor driver (in this example, the motor drivers in the first control branch and the second control branch are the high side gate driver 405H and the low side gate driver 405L, respectively). In the power transmission path, a switch device Q1/Q2 (for example, a PMOSFET) is disposed to control the on/off of the power transmission. In the first control branch, when the switch device Q1 is turned on, a first power SVcc1 is supplied from the power source to the high side gate driver 405H. Similarly, in the second control branch, when the switch device Q2 is turned on, a second power SVcc2 is supplied from the power source to the low side gate driver 405L. The output of the filter may be used as a gate-source voltage of the switch device Q1/Q2, thereby controlling the on/off of the switch device Q1/Q2, and accordingly controlling whether to supply the first power SVcc1 and the second power SVcc2 or not.

In the first control branch, the high side gate driver 405H outputs a gate driving signal for the high side IGBTs according to a drive control signal from the motor controller 407, such as a PWM signal, based on the first power SVcc1. Similarly, in the second control branch, the low side gate driver 405L outputs a gate driving signal for the low side IGBTs according to the drive control signal from the motor controller 407, such as the PWM signal, based on the second power SVcc2.

In normal operation (for example, +24V at the STO1 and the STO2), during the time when the switch device Q3 is turned on, the primary side LEDs of the first optocoupler U1 and the second optocoupler U2 each is turned on, and accordingly their respective secondary side triodes are each turned on. In the first/second control branch, there is an electrical path composed of the capacitor C1/C2 and the resistor R3/R4, thereby charging the capacitor C1/C2. Here, the resistance of the resistor R3/R4 may be set relatively small, so that the charging process of the capacitor C1/C2 is relatively fast, and thus the voltage across the capacitor C1/C2 may rise quickly to be higher than a threshold voltage of the switch device Q1/Q2. Then, the switch device Q1/Q2 may be turned on, and thus provides the first power SVcc1/ second power SVcc2 to the high side gate driver 405H/low side gate driver 405L. Therefore, the high side gate driver 405H/low side gate driver 405L may control the high side IGBTs/low side IGBTs to be turned on or off according to the drive control signal of the motor controller 407.

In addition, in normal operation (for example, +24V at the STO1 and the STO2), during the time when the switch device Q3 is turned off, the primary side LEDs of the first photocoupler U1 and the second photocoupler U2 each is turned off, and accordingly their respective secondary side triodes each is turned off. In the first/second control branch, the capacitor C1/C2 may be discharged through the resistor R1/R2. Here, the resistance of the resistor R1/R2 may be set relatively large, so that the discharging process of the capacitor C1/C2 is relatively slow. For example, the voltage across the capacitor C1/C2 will not drop below the threshold voltage of the switch device Q1/Q2 until next time the secondary side triode of the first/second photocoupler U1/U2 is turned on and thus the capacitor C1/C2 may be charged. As a result, the switch device Q1/Q2 may still remain turned on, and provides the first power SVcc1/the second power SVcc2, thereby driving the motor to operate properly. According to an embodiment of the present disclosure, the resistance of the resistor R1/R2 and R3/R4 may be set such that the resistance of the resistor R1/R2, compared to that of the resistor R3/R4, is sufficiently large that the charging process of the capacitor C1/C2 is much faster than the discharging process, and thus a relatively high voltage (higher than the threshold voltage of the switch device Q1/Q2) across the capacitor C1/C2 is able to be maintained. For example, in the case where the oscillator has a duty cycle of about 50%, the resistance of the resistor R1 may be greater than twice the resistance of the resistor R3, and the resistance of the resistor R2 may be greater than twice the resistance of the resistor R4.

More generally, the cutoff frequency of the filter 411-41/411-2 ($1/(2\pi R_3 C_1)$ or $1/(2\pi R_4 C_2)$) may be set to be lower than the on/off frequency f of the primary side. In one example, the capacitance $C_1/C_2$ of the capacitor C1/C2 may be 1 μF, the resistance $R_1/R_2$ of the resistor R1/R2 may be 2.2 kΩ, the resistance $R_3/R_4$ of the resistor R3/R4 may be 330Ω, and the on/off frequency f may be 2 kHz. As such, the low pass filter may filter out the high frequency characteristics in the oscillating signal, and thus the output of the filter may be a substantially stable voltage.

In the case where a STO function is triggered, for example, the input signal at at least one of the STO1 and the STO2 is at 0V (with respect to the STO signal ground SGND) or opened, an optocoupler of a control branch, in which a valid STO is received, among the first control branch and the second control branch stops operating, and a respective capacitor C1 and/or C2 may be discharged (since the optocoupler stops operating, it is no longer charged, and thus the capacitor will discharge to a zero voltage). Then, the supplying of at least one of the first power SVcc1 and the second power SVcc2 may be stopped, and accordingly at least one of the high side gate driver 405H and the low side gate driver 405L may stop operating. Therefore, the torque of the motor may be turned off.

As described above, a diagnostic circuit 413 may also be combined. The diagnostic circuit 413 may monitor the output of the first optocoupler U1 (the voltage at point A in the figure), the output of the second optocoupler U2 (the voltage at point B in the figure), the first power SVcc1 (the voltage at point C in the figure), and the second power SVcc2 (the voltage at point D in the figure). Based on these monitored values, it is possible to diagnose the state of the STO circuit, in particular, that of the control branches therein.

For example, when an output of a secondary side of the first optocoupler U1 or the second optocoupler U2 is an oscillating waveform (indicating that the oscillator oscillates normally, and the optocoupler operates properly), and a respective first power SVcc1 or second power SVcc2 has a voltage sufficient to drive the motor driving circuit (indicating that the power supply circuit supplies power), the diagnostic circuit 413 may determine that a respective first control branch or second control branch is in a normal operating state.

For another example, when the output of the secondary side of the first optocoupler U1 or the second optocoupler U2 indicates that the secondary side is in a continuous-OFF state (indicating that the primary side may be in an OFF state), and the respective first power SVcc1 or the second power SVcc2 has a voltage insufficient to drive the motor driving circuit (indicating that the power supply circuit does not supply power), the diagnostic circuit 413 may determine that a STO function in the respective first control branch or the second control branch is activated or a respective first optocoupler U1 or the second optocoupler U2 has failed (for example, the fault that the primary side and/or the secondary side of the optocoupler cannot be turned on).

For another example, when the output of the secondary side of the first optocoupler U1 or the second optocoupler U2 indicates that the secondary side is in a continuous-ON state (indicating that the primary side may be in the continuous-ON state), and the respective first power SVcc1 or the second power SVcc2 has a voltage sufficient to drive the motor driving circuit (indicating that the power supply circuit supplies power), the diagnostic circuit 413 may determine that the respective first photocoupler U1 or the second photocoupler U2 has failed (e.g., a stuck-at fault has occurred).

In this example, in the case where the first control branch and the second control branch share the oscillator, the operating state of the STO circuit may also be diagnosed based on respective states of the two control branches.

For example, when an output of a secondary side of an optocoupler (e.g., U1) on one of the first control branch and the second control branch is an oscillating waveform (indicating that the oscillator is oscillating normally, and the U1 is operating properly) and a respective power supply has a voltage sufficient to drive the motor driving circuit (i.e., the first power SVcc1 is supplied), and an output of a secondary side of an optocoupler (e.g., U2) on the other of the first control branch and the second control branch indicates that the secondary side is in the continuous-OFF state and a respective power supply has a voltage insufficient to drive the motor driving circuit, the diagnostic circuit 413 may determine that an STO function in the other control branch is activated (e.g., the STO signal at the STO2 is valid, and thus the primary side of the U2 is turned off) or a respective photocoupler (for example, the U2) has failed (for example, the oscillation signal oscillating normally cannot be transmitted to the secondary side).

As another example, when an output of a secondary side of one of the first optocoupler U1 and the second optocoupler U2 (e.g., U1) is an oscillating waveform (indicating that the oscillator is oscillating normally, and the U1 is operating properly), an output of a secondary side of the other one (e.g., U2) indicates that the secondary side is in a continuous-ON state, and the first power and the second power each have a voltage sufficient to drive the motor driving circuit, the diagnostic circuit 413 may determine that an optocoupler in which the secondary side is in the continuous-ON state (for example, U2) has failed (for example, a stuck-at fault has occurred).

For still another example, when outputs of secondary sides of the first optocoupler U1 and the second optocoupler U2 indicate that the secondary sides of both the first optocoupler and the second optocoupler are in a continuous-ON state, and the first power and the second power each has a voltage sufficient to drive the motor driving circuit, the diagnostic circuit 413 may determine that the shared oscillator U3 has failed (of course, it is also possible that a fault, such as a stuck-at fault, has occurred to both optocouplers simultaneously, but the probability is low).

In the above case, a power supplying state of the power supply circuit is consistent with a state of the secondary side of the optocoupler (that is, there is power being supplied when the secondary side of the optocoupler is turned on, and there is no power being supplied when the secondary side of the optocoupler is turned off). There may also be cases where they are inconsistent with each other.

For example, when the output of the secondary side of the first photocoupler U1 indicates that the secondary side is in the continuous-OFF state, but the first power SVcc1 has a voltage sufficient to drive the motor driving circuit, the diagnostic circuit 413 may determine that the first switch device Q1 has failed (for example, maintains always-ON).

For another example, when the output of the secondary side of the second photocoupler U2 indicates that the secondary side is in the continuous-OFF state, but the second power SVcc2 has a voltage sufficient to drive the motor driving circuit, the diagnostic circuit 413 may determine that the second switch device Q2 has failed (for example, maintains always-ON).

The diagnostic circuit 413 may be implemented by a logic component such as a micro processing unit (MCU) or a complex programmable logic device (CPLD), and may be implemented in the manner of a lookup table or the like. Of course, it may be implemented by discrete components in the manner of combined logic circuits, and the like. Table 1 below schematically shows some diagnostic logic.

TABLE 1

| Signal | | | | |
|---|---|---|---|---|
| A | B | C | D | Determination |
| | | | | High security level |
| OSC. | OSC. | H | H | OK, no STO occurred |
| H | H | L | L | OK, both STO1 and STO2 are valid |
| H | OSC. | L | H | STO1 is valid, or the optocoupler U1 has failed |
| OSC. | H | H | L | STO2 is valid, or the optocoupler U2 has failed |
| L | OSC. | H | H | The optocoupler U1 has failed |
| OSC. | L | H | H | The optocoupler U1 has failed |
| L | L | H | H | The oscillation circuit has failed, downgraded to be at a low safety level |
| | | | | Low security level |
| L | L | H | H | OK, no STO occurred |
| H | H | L | L | OK, both STO1 and STO2 are valid |
| H | L | L | H | STO1 is valid |
| L | H | H | L | STO2 is valid |
| | | | | High/low security level |
| H | x | H | x | The source and drain of the switch device Q1 are short circuited |
| x | H | x | H | The source and drain of the switch device Q2 are short circuited |

Remarks: OSC. stands for oscillating signal, H stands for high level signal, L stands for low level signal, and x stands for arbitrary signal Different operations may be performed depending on the diagnosed operating state. For example, when a STO valid state or a fault that affects motor operation (e.g., an fault of the optocoupler) is detected, the diagnostic circuit may send a signal instructing the system to stop operating. For example, the diagnostic circuit 413 may instruct the motor controller 407 to stop outputting the drive control signal. In addition, when a fault is detected but the motor can still operate by bypassing the faulty component (e.g., an fault of the oscillating circuit), the diagnostic circuit may send a signal instructing to downgrade to a low safety level (of course the system may stop operating). For example, the diagnostic circuit 413 may instruct the switch device Q3 to be in the always-ON state. At the low safety level, the diagnostic circuit may diagnose fewer operating states as shown in the above table.

According to an embodiment of the present disclosure, a circuit with high safety specification and a circuit with low safety specification may be implemented by the same circuit board such as a printed circuit board (PCB), and thus may be manufactured by the same production line. For the circuit with high safety specification, for example, production may be carried out in accordance with the layout shown in FIG. 4. Whereas, for the circuit with low safety specification, it may be implemented by not installing, for example, one or more of components that the welding diagnosis involves, such as the oscillator U3, the switch device Q3, and the diagnostic circuit 413. At the pad originally used for the switch device Q3, it may be directly shorted.

In the above embodiment, the primary side on/off control circuit forms a series connection configuration with the primary side of the optocoupler, and the two paths share the same primary side on/off control circuit, but the present disclosure is not limited thereto.

FIGS. 5-8 schematically illustrate a circuit diagram of a primary side on/off control circuit according to various embodiments of the present disclosure.

Figure 5:
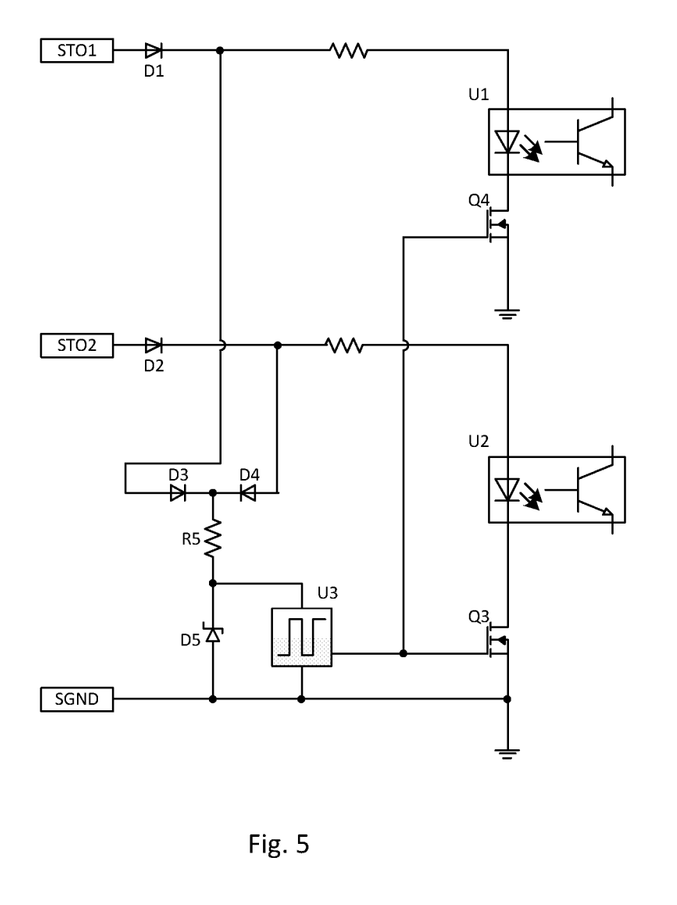
FIGS. 5-8 schematically illustrate a circuit diagram of a primary side on-off control circuit according to various embodiments of the present disclosure.

As shown in FIG. 5, a primary side on/off control circuit (U3, Q4; U3, Q3) according to this embodiment still employs a series connection configuration, but the two paths have respective switch devices Q3 and Q4, respectively. In addition, the two paths share the same oscillator U3.

Figure 6:
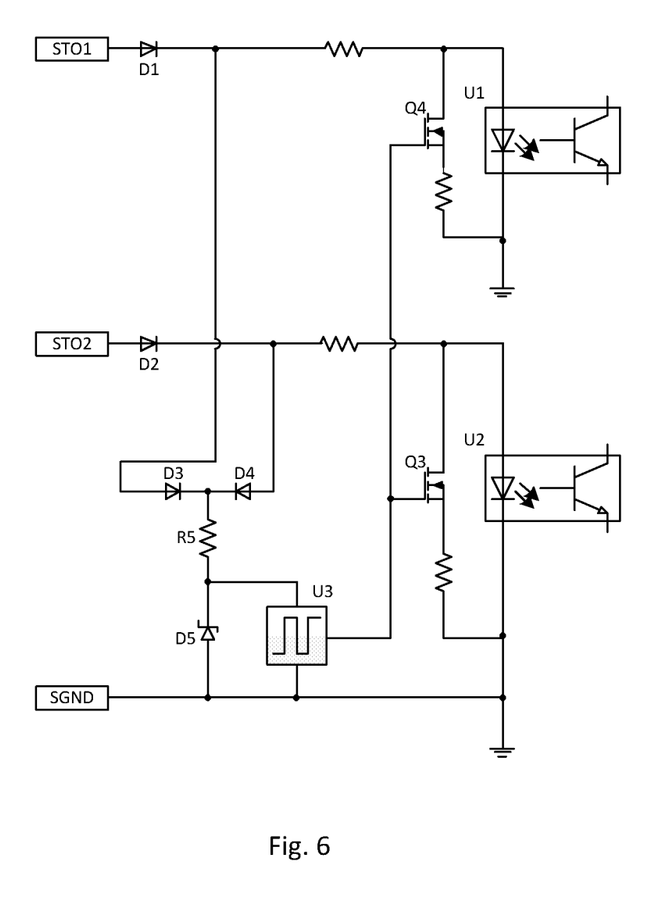

As shown in FIG. 6, a primary side on/off control circuit (U3, Q4; U3, Q3) according to this embodiment employs a parallel connection configuration. Specifically, a bypass branch is connected in series with primary sides of optocouplers U1 and U2, respectively. Switch devices Q3, Q4 (and resistors, which, for example, may limit current) are included in the bypass branch to periodically turn on or off the bypass branch. When the bypass branch is turned on, the primary side of the optocoupler may be bypassed (i.e., current will pass through the bypass branch but bypass the primary side of the optocoupler). For example, this may be realized by setting the resistance of the bypass branch to be much smaller than that of the secondary side of the optocoupler. Similarly, the two paths share the same oscillator U3.

Figure 7:
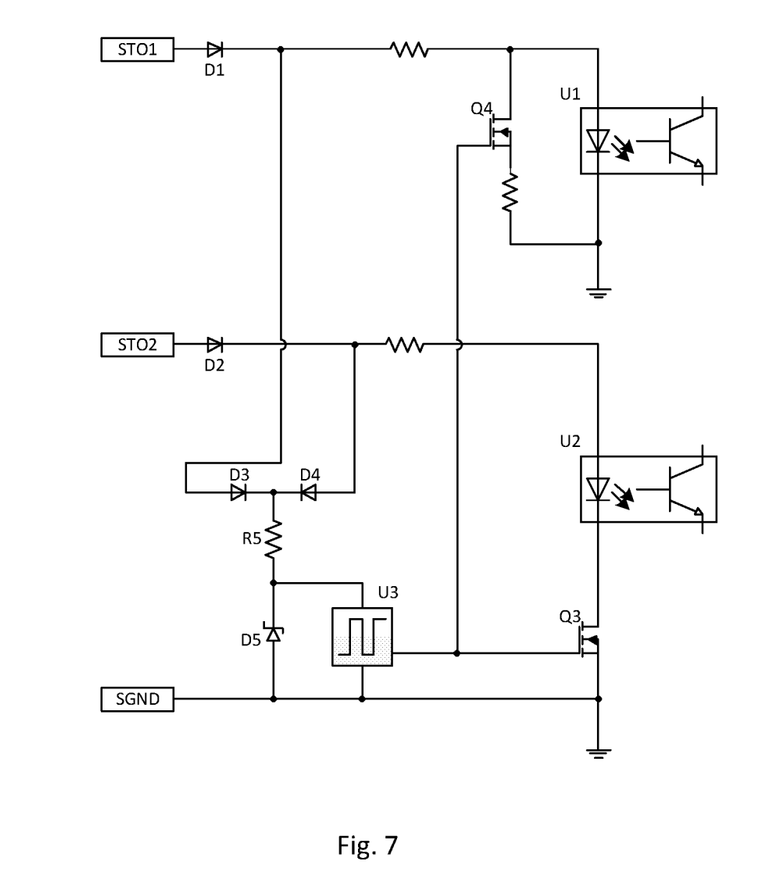

As shown in FIG. 7, in this embodiment, a primary side on/off control circuit (U3, Q4) in one branch employs a parallel connection configuration, and a primary side on/off control circuit (U3, Q3) in the other branch employ a series connection configuration. Similarly, the two branches share the same oscillator.

Figure 8:
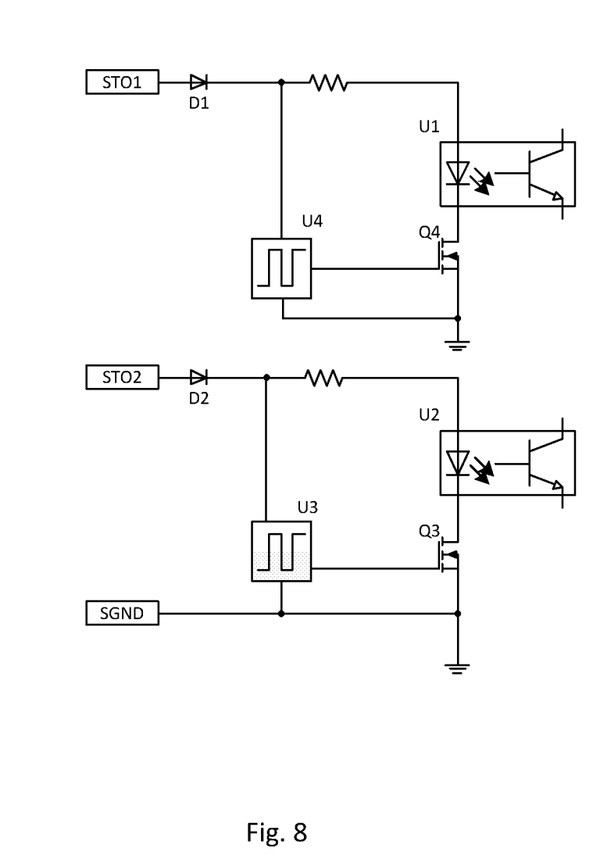

As shown in FIG. 8, a primary side on/off control circuit according to the present embodiment employs a series connection configuration, but two branches have respective primary side on/off control circuits (U4, Q4; U3, Q3), respectively, and do not share an oscillator or switch device.

According to an embodiment, the design of the primary side on/off control circuit may be any combination of different options such as a series connection configuration, a parallel connection configuration, and whether or not to share an oscillator, whether or not to share a switch device, or the like.

Figure 9:
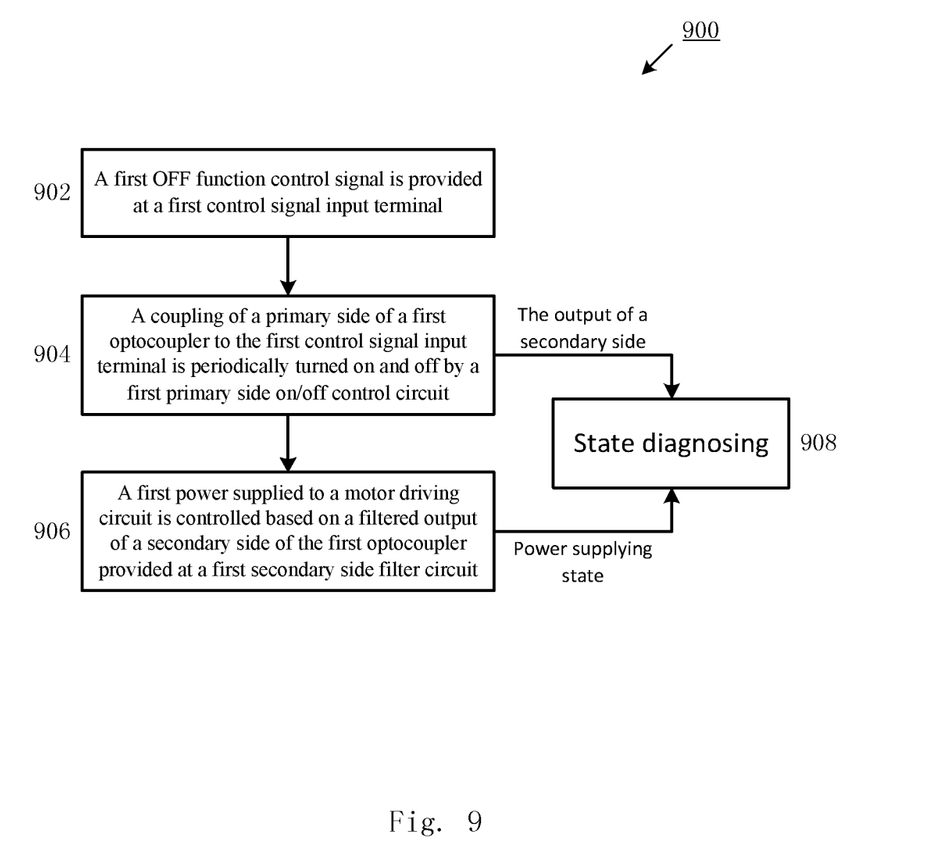
FIG. 9 schematically illustrates a flow chart of a method for operating a control circuit according to an embodiment of the present disclosure.

FIG. 9 schematically illustrates a flow chart of a method for operating the control circuit described above according to an embodiment of the present disclosure.

As shown in FIG. 9, a control method 900 according to the present embodiment may include the following operations.

In operation 902, a first OFF function control signal may be provided at a first control signal input terminal. For example, the first OFF function control signal is an STO signal.

In operation 904, a coupling of a primary side of a first optocoupler to the first control signal input terminal may be periodically turned on and off by a first primary side on/off control circuit.

In operation 906, a first power supplied to a motor driving circuit may be controlled based on a filtered output of a secondary side of the first optocoupler provided at a first secondary side filter circuit. As described above, the filtered output may control a switch device included in a power transmission path that supplies power to the motor driving circuit.

With the above operation, an OFF control of the motor, such as STO control, may be realized.

Additionally, in operation 908, a state diagnosis may be performed. As described above, an operating state of the control circuit may be diagnosed based on the output of the secondary side of the first optocoupler and the first power supplied to the motor driving circuit.

A second control branch may operate similarly.

The control circuit according to an embodiment of the present disclosure may be applied in various applications, particularly the application in which STO is required, for example, an electronic device such as a frequency converter.

According to an embodiment of the present disclosure, the method described above with reference to the flowchart may be implemented as a computer software program. For example, an embodiment of the present disclosure includes a computer program product comprising a computer program embodied on a computer readable medium. The computer program comprises a program code for executing the method illustrated in the flowchart. In such an embodiment, the computer program may be downloaded from the network and installed, and/or installed from a removable medium. The computer program, when executed by a processor, executes above-described functions defined in the system of the embodiment of the present disclosure. The systems, devices, apparatus, modules, units, and the like described above may be implemented by a computer program module, according to an embodiment of the present disclosure.

It should be noted that the computer readable medium illustrated in the present disclosure may be a computer readable signal medium or a computer readable storage medium or any combination thereof. The computer readable storage medium may be, for example, but not limited to, an electrical, magnetic, optical, electromagnetic, infrared, or semiconductor system, apparatus, or device, or any combination of the foregoing. More specific examples of the computer readable storage media may include, but are not limited to, an electrical connection having one or more wires, a portable computer disk, a hard disk, a random access memory (RAM), a read only memory (ROM), an erasable programmable read only memory (EPROM or Flash memory), an optical fiber, a portable compact disk read only memory (CD-ROM), an optical storage device, a magnetic storage device, or any suitable combination of the foregoing. In the present disclosure, a computer readable storage medium may be any tangible medium that may encompass or store a program for use by or in connection with an instruction execution system, apparatus, or device. And in the present disclosure, a computer readable signal medium may include a propagated data signal with computer readable program code embodied therein, for example, in a baseband or as part of a carrier wave. Such an propagated data signal may take a variety of forms, including, but not limited to, an electromagnetic signal, an optical signal, or any suitable combination of the foregoing. The computer readable signal medium may also be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including, but not limited to, wireless, cable, optical cable, RF, etc., or any suitable combination of the foregoing.

The embodiments of the present disclosure have been described above. However, these examples are for illustrative purposes only and are not intended to limit the scope of the disclosure. Although various embodiments have been described above, this does not mean that measures in the various embodiments cannot advantageously used in connection. The scope of the present disclosure is defined by the appended claims and their equivalents. Numerous alternatives and modifications may be made by those skilled in the art without departing from the scope of the present disclosure, and the alternatives and modifications would fall within the scope of the present disclosure.

What is claimed is:

1. A control circuit comprising:
    a first control branch, wherein, the first control branch includes:
        a first control signal input terminal configured to receive a first OFF function control signal;
        a first optocoupler including a primary side and a secondary side, wherein the primary side is coupled to the first control signal input terminal, and an output of the secondary side is configured to control a first power supplied to a motor driving circuit;
        a first primary side on/off control circuit connected to the primary side of the first optocoupler, and configured to periodically turn on and off the coupling of the primary side to the first control signal input terminal; and
        a first secondary side filter circuit connected to the secondary side of the first optocoupler, and configured to filter the output of the secondary side, wherein the first secondary side filter is configured as a low pass filter having a cutoff frequency lower than an on/off frequency of the primary side controlled by the first primary side on/off control circuit,
    a second control branch, wherein, the second control branch includes:
        a second control signal input terminal configured to receive a second OFF function control signal;
        a second optocoupler including a primary side and a secondary side, wherein the primary side is coupled to the second control signal input terminal, and an output of the secondary side is configured to control a second power supplied to the motor driving circuit;
        a second primary side on/off control circuit connected to the primary side of the second optocoupler, and configured to periodically turn on and off the coupling of the primary side to the second control signal input terminal; and
        a second secondary side filter circuit connected to the secondary side of the second optocoupler, and configured to filter the output of the secondary side, wherein the second secondary side filter is configured as a low pass filter having a cutoff frequency lower than an on/off frequency of the primary side controlled by the second primary side on/off control circuit,
    the control circuit further comprises a diagnostic circuit configured to diagnose an operating state of the control circuit based on the output of the secondary side of the first optocoupler and the first power,
    the diagnostic circuit is further configured to diagnose the operating state of the control circuit based on the output of the secondary side of the second optocoupler and the second power.

2. The control circuit of claim 1, wherein each of the first primary side on/off control circuit and the second primary side on/off control circuit has one of:
    a series connection configuration comprising a switch device connected in series with a primary side of a respective optocoupler and configured to be periodically turned on and off so as to periodically turn on/off the coupling of the primary side of the respective optocoupler to a respective control signal input terminal; or
    a parallel connection configuration comprising a bypass branch connected in parallel with a primary side of a respective optocoupler, the bypass branch comprising a switch device configured to be periodically turned on and off so as to periodically bypass the primary side of the respective optocoupler.

3. The control circuit of claim 2, wherein the first primary side on/off control circuit and the second primary side on/off control circuit each has the series connection configuration and shares the same switch device or have different respective switch devices.

4. The control circuit of claim 2, wherein
    one of the first primary side on/off control circuit and the second primary side on/off control circuit has the series connection configuration, and the other has the parallel connection configuration; or
    both the first primary side on/off control circuit and the second primary side on/off control circuit have the parallel connection configuration.

5. The control circuit of claim 4, wherein the first primary side on/off control circuit and the second primary side on/off control circuit each comprises an oscillator configured to output an oscillating signal for controlling respective switch device.

6. The control circuit of claim 5, wherein the power supplied to respective oscillators of the first primary side on/off control circuit and the second primary side on/off control circuit are based on an input at the first control signal input terminal and an input at the second control signal input terminal, respectively.

7. The control circuit of claim 5, wherein the first primary side on/off control circuit and the second primary side on/off control circuit share the same oscillator.

8. The control circuit of claim 7, wherein a power is supplied to the shared oscillator when an input at least one of the first control signal input terminal and the second control signal input terminal is high.

9. The control circuit of claim 7, wherein
    when an output of a secondary side of an optocoupler on one of the first control branch and the second control branch is an oscillating waveform and a respective power has a voltage sufficient to drive the motor driving circuit, and an output of a secondary side of an optocoupler on the other of the first control branch and the second control branch indicates that the secondary side is in a continuous-OFF state and a respective power has a voltage insufficient to drive the motor driving circuit, the diagnostic circuit determines that an OFF function is activated in the other control branch or a respective optocoupler has failed;

when an output of a secondary side of one of the first optocoupler and the second optocoupler is the oscillating waveform, an output of a secondary side of the other of the first optocoupler and the second optocoupler indicates that the secondary side is in a continuous-ON state, and the first power and the second power have voltages sufficient to drive the motor driving circuit, the diagnostic circuit determines that the optocoupler of which the secondary side is in the continuous-ON state has failed;

when outputs of secondary sides of the first optocoupler and the second optocoupler indicate that the secondary sides of the first optocoupler and the second optocoupler are both in the continuous-ON state, and the first power and the second power have voltages sufficient to drive the motor driving circuit, the diagnostic circuit determines that the shared oscillator has failed.

10. The control circuit of claim 1, wherein
the first control branch further includes a first power transmission path configured to transmit the first power from a power source to the motor driving circuit, wherein the first power transmission path includes a first switch device, and the filtered output of the secondary side of the first optocoupler is configured to control the on/off of the first switch device so as to turn on or off the first power transmission path, the second control branch further includes a second power transmission path configured to transmit the second power from the power source to the motor driving circuit, wherein the second power transmission path includes a second switch device, and the filtered output of secondary side of the second optocoupler is configured to control the on/off of the second switch device so as to turn on or off the second power transmission path.

11. The control circuit of claim 10, wherein
when the output of the secondary side of the first optocoupler indicates that the secondary side is in a continuous-OFF state, but the first power has a voltage sufficient to drive the motor driving circuit, the diagnostic circuit determines that the first switch device has failed; and/or when the output of the secondary side of the second optocoupler indicates that the secondary side is in the continuous-OFF state, but the second power has a voltage sufficient to drive the motor driving circuit, the diagnostic circuit determines that the second switch device has failed.

12. The control circuit of claim 1, wherein the low pass filter comprises a RC low pass filter composed of a first resistor and a capacitor, to provide a filtered output across the capacitor.

13. The control circuit of claim 12, further comprising a second resistor connected across the capacitor, wherein compared to a resistance of the first resistor, a resistance of the second resistor is sufficiently large that a charge process of the capacitor is faster than a discharge process thereof.

14. The control circuit of claim 1, wherein
the diagnostic circuit, when determining that at least one of the first primary side on/off control circuit and the second primary side on/off control circuit has failed, is configured to instruct the control circuit to downgrade to operate at a low safety level or instruct a motor controller to stop outputting a drive control signal for the motor driving circuit.

15. The control circuit of claim 1, wherein
when the output of the secondary side of the first optocoupler is an oscillating waveform, and the first power has a voltage sufficient to drive the motor driving circuit, the diagnostic circuit determines that the first control branch is in a normal operating state;

when the output of the secondary side of the first optocoupler indicates that the secondary side is in a continuous-OFF state, and the first power has a voltage insufficient to drive the motor driving circuit, the diagnostic circuit determines that an OFF function is activated in the first control branch or the optocoupler has failed;

when the output of the secondary side of the first optocoupler indicates that the secondary side is in a continuous-ON state, and the first power has a voltage sufficient to drive the motor driving circuit, the diagnostic circuit determines that the first optocoupler has failed.

16. The control circuit of claim 1, wherein
the first OFF function control signal is a first Safety Torque Off signal, and indicates to turn off the first power supplied to the motor driving circuit, when it is not high level, the second OFF function control signal is a second Safety Torque Off signal, and indicates to turn off the second power supplied to the motor driving circuit, when it is not high level.

17. A method for operating a control circuit according to claim 1, comprising:
providing a first OFF function control signal at a first control signal input terminal;

periodically turning on and off a coupling of a primary side of a first optocoupler to the first control signal input terminal via a first primary side on/off control circuit;

controlling a first power supplied to a motor driving circuit based on a filtered output of a secondary side of the first optocoupler provided at a first secondary side filter circuit; and diagnosing an operating state of the control circuit based on the output of the secondary side of the first optocoupler and the first power supplied to the motor driving circuit.

18. An electronic device comprising a control circuit according to claim 1.

19. A storage medium having stored thereon executable instructions that, when executed by one or more processors, cause the one or more processors to perform a method according to claim 17.

* * * * *

UNITED STATES PATENT AND TRADEMARK OFFICE
CERTIFICATE OF CORRECTION

PATENT NO. : 10,630,210 B2
APPLICATION NO. : 16/108967
DATED : April 21, 2020
INVENTOR(S) : Xiaoran Xu It is certified that error appears in the above-identified patent and that said Letters Patent is hereby corrected as shown below:

In the Claims

Column 18, Claim 8, Line 52, after "when an input at," please insert the word -- at --.

Signed and Sealed this
Twenty-third Day of May, 2023

Katherine Kelly Vidal
*Director of the United States Patent and Trademark Office*